United States Patent
Harame et al.

(10) Patent No.: US 9,349,845 B2
(45) Date of Patent: May 24, 2016

(54) SELF-ALIGNED BIPOLAR JUNCTION TRANSISTORS

(71) Applicant: GLOBALFOUNDRIES INC., Grand Cayman (KY)

(72) Inventors: David L. Harame, Essex Junction, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/495,057

(22) Filed: Sep. 24, 2014

(65) Prior Publication Data

US 2015/0008558 A1 Jan. 8, 2015

Related U.S. Application Data

(62) Division of application No. 13/847,695, filed on Mar. 20, 2013, now Pat. No. 8,927,381.

(51) Int. Cl.

| | |
|---|---|
| H01L 29/66 | (2006.01) |
| H01L 29/735 | (2006.01) |
| H01L 29/732 | (2006.01) |
| H01L 29/06 | (2006.01) |
| H01L 29/10 | (2006.01) |
| H01L 27/082 | (2006.01) |
| H01L 29/73 | (2006.01) |
| G06F 17/50 | (2006.01) |

(52) U.S. Cl.
CPC .......... *H01L 29/735* (2013.01); *G06F 17/5045* (2013.01); *H01L 27/0823* (2013.01); *H01L 29/0649* (2013.01); *H01L 29/1004* (2013.01); *H01L 29/1008* (2013.01); *H01L 29/66234* (2013.01); *H01L 29/66272* (2013.01); *H01L 29/73* (2013.01); *H01L 29/732* (2013.01)

(58) Field of Classification Search
None
See application file for complete search history.

(56) References Cited

U.S. PATENT DOCUMENTS

| | | | |
|---|---|---|---|
| 5,484,737 | A | 1/1996 | Ryum et al. |
| 6,864,560 | B2 | 3/2005 | Khater et al. |
| 7,342,293 | B2 | 3/2008 | Wallner et al. |
| 7,880,270 | B2 | 2/2011 | Heinemann et al. |
| 2003/0096486 | A1* | 5/2003 | Chuang et al. ............... 438/309 |
| 2005/0104160 | A1* | 5/2005 | Ahmed ............ H01L 29/42304 257/565 |
| 2008/0067631 | A1 | 3/2008 | Chidambarrao et al. |
| 2009/0020851 | A1* | 1/2009 | Liu et al. ...................... 257/565 |

(Continued)

FOREIGN PATENT DOCUMENTS

| | | |
|---|---|---|
| CN | 102738154 A | 10/2012 |
| JP | 2004158645 A | 6/2004 |

OTHER PUBLICATIONS

James W. Adkisson, U.S. Appl. No. 13/705,717 entitled "Bipolar Junction Transistors With Reduced Base-Collector Junction Capacitance" filed Dec. 5, 2012.

(Continued)

*Primary Examiner* — Daniel Whalen

(74) *Attorney, Agent, or Firm* — Thompson Hine LLP; Anthony J. Canale

(57) ABSTRACT

Device structures and design structures for a bipolar junction transistor. An intrinsic base is formed on the substrate, a terminal is formed on the intrinsic base, and an extrinsic base is formed that is arranged in juxtaposition with the intrinsic base on the substrate. The intrinsic base and terminal are respectively comprised of first and second semiconductor materials.

9 Claims, 8 Drawing Sheets

(56) References Cited

U.S. PATENT DOCUMENTS

| | | | |
|---|---|---|---|
| 2010/0327280 A1* | 12/2010 | Joseph et al. | 257/51 |
| 2011/0312147 A1 | 12/2011 | Harame et al. | |
| 2012/0228611 A1 | 9/2012 | Chan et al. | |
| 2013/0119516 A1 | 5/2013 | Harame et al. | |
| 2014/0231877 A1* | 8/2014 | Adkisson et al. | 257/198 |

OTHER PUBLICATIONS

Washio, "SiGe HBTs and ICs for optical-fiber communication systems", Solid-State Electronics 43 (1999) 1619-1625.

J. Chu et al., "High speed, collector-Up silicon heterojunction bipolar transistor structure", IBM Tech. Discl. Bulletin, vol. 34, No. 7A, pp. 266-270 (1991).

Donkers, et al., A novel fully self-aligned SiGe:C HBT architecture featuring a single-step epitaxial collector-base process , : 2007 IEEE International Electron Devices Meeting—IEDM '07, pp. 655-658 (2007).

S. Van Huylenbroeck et al., "A 400GHz fMAX Fully Self-Aligned SiGe:C HBT Architecture", Proc. IEEE Bipolar BiCMOS Circuits Technology Meeting, pp. 5-8, (2009).

DB Whalen, Examiner, USPTO, Notice of Allowance issued in U.S. Appl. No. 13/847,695 dated Sep. 3, 2014.

* cited by examiner

US 9,349,845 B2

SELF-ALIGNED BIPOLAR JUNCTION TRANSISTORS

BACKGROUND

The invention relates generally to semiconductor device fabrication and, in particular, to device structures for a bipolar junction transistor, fabrication methods for a bipolar junction transistor, and design structures for a bipolar junction transistor.

Bipolar junction transistors are typically found in demanding types of integrated circuits, especially integrated circuits destined for high-frequency applications and high-power applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors constitute three-terminal electronic devices constituted by three semiconductor regions, namely an emitter, a base, and a collector. An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Improved device structures, fabrication methods, and design structures are needed that enhance the device performance of bipolar junction transistors.

SUMMARY

In an embodiment of the invention, a method is provided for fabricating a bipolar junction transistor. The method may include forming a first layer on a substrate, forming a second layer on the first layer, and forming a trench that penetrates through the second layer to define a sidewall of a terminal for the bipolar junction transistor. The first and second layers are respectively comprised of first and second semiconductor materials. The method further includes introducing an impurity species into a first section of the first layer at a base of the trench while a second section of the first layer is masked by the terminal The second section of the first layer comprises an intrinsic base of the bipolar transistor.

In an embodiment of the invention, a device structure is provided for a bipolar junction transistor formed using a substrate having a top surface. The device structure may include an intrinsic base on the substrate, a terminal on the intrinsic base, and an extrinsic base arranged in juxtaposition with the intrinsic base on the substrate. The intrinsic base and terminal are respectively comprised of first and second semiconductor materials.

In an embodiment of the invention, a hardware description language (HDL) design structure is encoded on a machine-readable data storage medium. The HDL design structure comprises elements that, when processed in a computer-aided design system, generates a machine-executable representation of a device structure for a bipolar junction transistor. The HDL design structure may include an intrinsic base on the substrate, a terminal on the intrinsic base, and an extrinsic base arranged in juxtaposition with the intrinsic base on the substrate. The intrinsic base and terminal are respectively comprised of first and second semiconductor materials. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
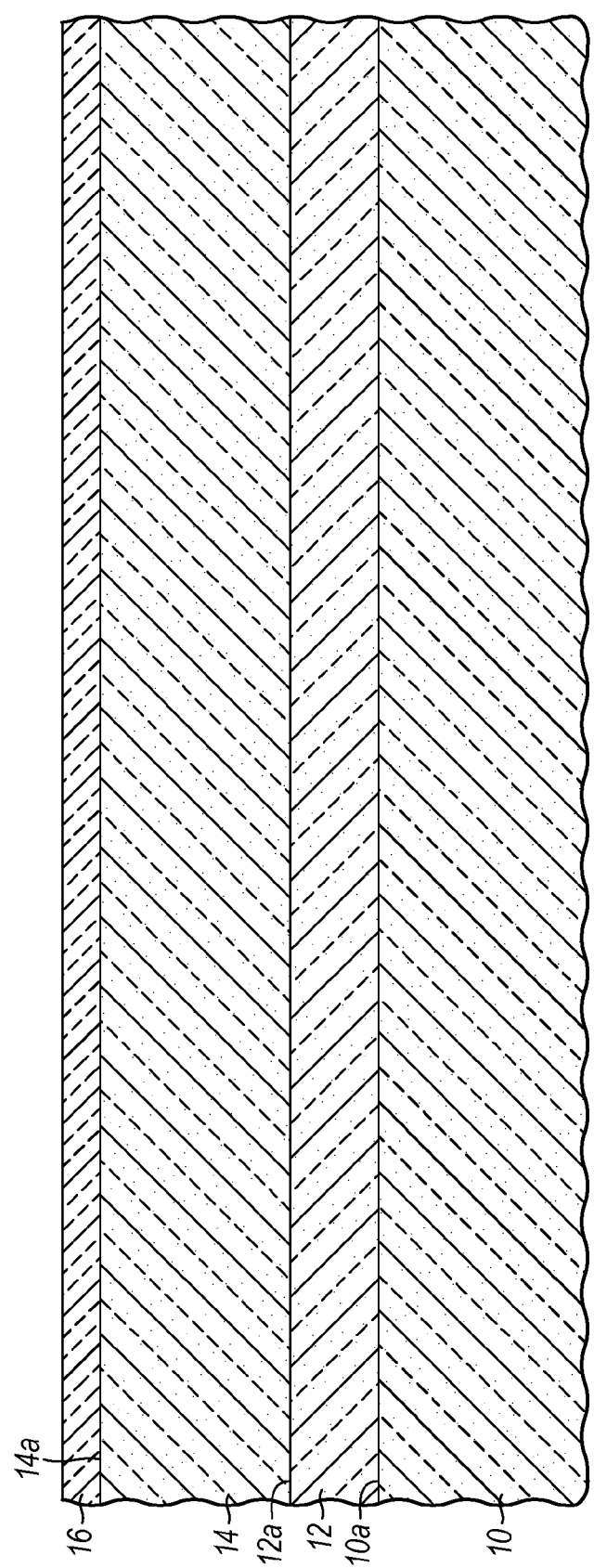
FIGS. 1-7 are cross-sectional views of a portion of a substrate at successive fabrication stages of a processing method for fabricating a device structure in accordance with an embodiment of the invention.
Figure 7:
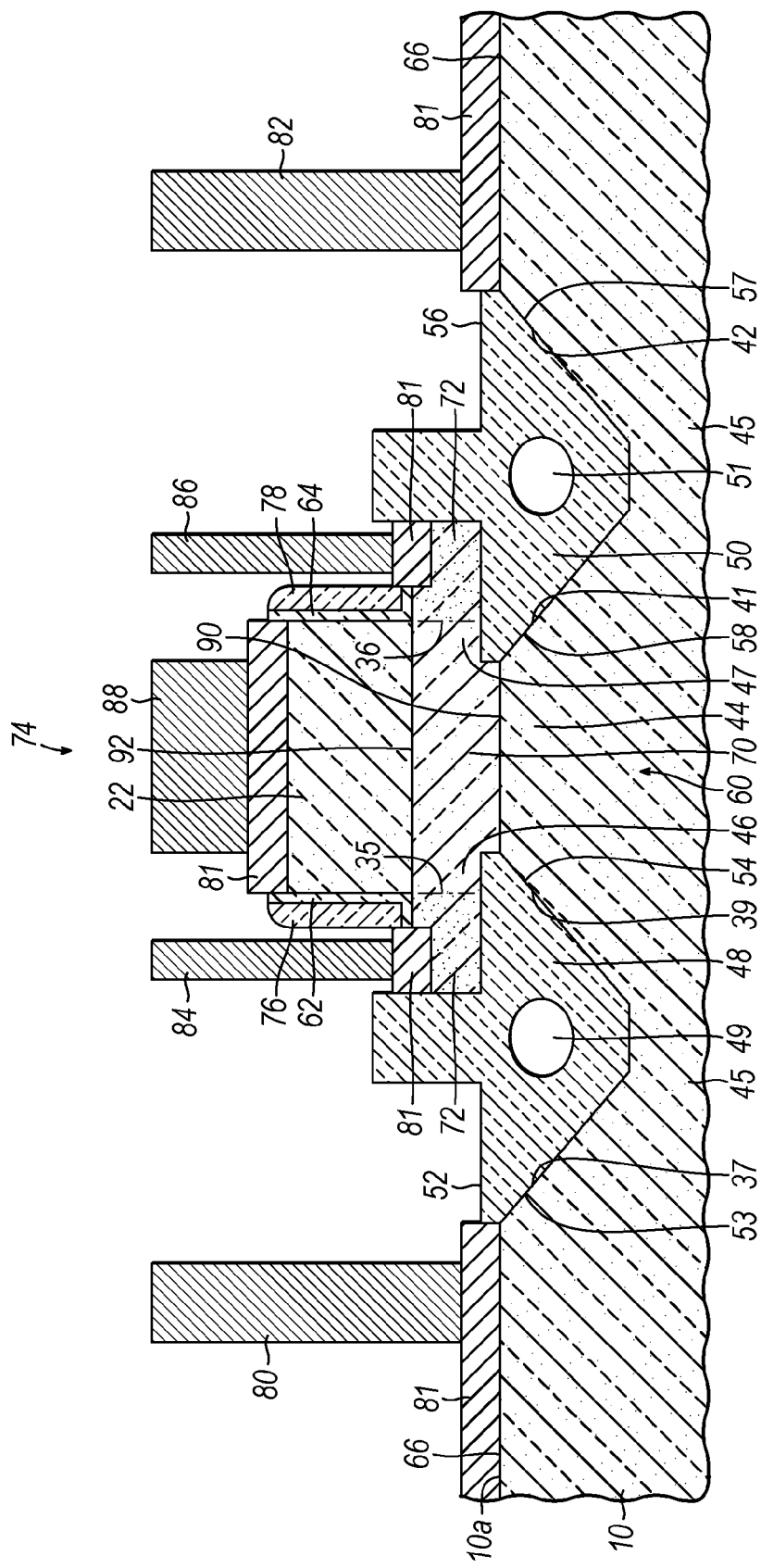

With reference to FIG. 1 and in accordance with an embodiment of the invention, a substrate 10 is used in the fabrication of a bipolar junction transistor 74 (FIG. 7). The substrate 10 may be any suitable bulk substrate comprising a semiconductor material that a person having ordinary skill in the art would recognize as suitable for forming an integrated circuit. For example, substrate 10 may be comprised of a wafer of a single crystal silicon-containing material, such as single crystal silicon with a (100) crystal lattice orientation. The semiconductor material comprising substrate 10 may be doped with an impurity to alter its electrical properties with an electrically-active dopant and may also include an optional epitaxial layer. In one embodiment, the substrate 10 may include an n-type impurity species from Group V of the Periodic Table (e.g., phosphorus (P), arsenic (As), or antimony (Sb)) effective to impart n-type conductivity. For example, a surface layer of the substrate may be implanted with the ions of the impurity species and subsequently annealed to activate the impurity species and alleviate implantation damage, or the optional epitaxial layer may be in situ doped during growth.

A base layer 12 is formed as a continuous additive layer on the top surface 10a of substrate 10. The base layer 12 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the base layer 12 may be uniform or the germanium content of base layer 12 may be graded and/or stepped across the thickness of base layer 12. If the germanium content is stepped, thicknesses of the base layer 12, such as respective thicknesses directly contacting the substrate 10 and adjacent to the top surface 12a, may not contain any germanium and may therefore be entirely comprised of silicon (Si). The base layer 12 may be doped with one or more impurity species, such as boron and optionally carbon.

Base layer 12 may be formed using a low temperature epitaxial (LTE) growth process, such as vapor phase epitaxy (VPE) that may be conducted at a growth temperature ranging from 400° C. to 850° C. Single crystal semiconductor material (e.g., single crystal silicon and/or single crystal SiGe) is epitaxially grown or deposited onto any exposed crystalline surface such as the exposed top surface 10a of substrate 10. For example, the single-crystal semiconductor material of the substrate 10 serves as a crystalline template for the growth of at least the section of base layer 12 that is coextensive with the substrate 10.

A layer 14, which may comprise a semiconductor material, is formed on the top surface 12a of base layer 12. For example, layer 14 may be comprised of polysilicon deposited by CVD or LPCVD. Layer 14 may be undoped over a surface layer near the top surface 14a and heavily doped over a thickness between the surface layer and the top surface 12a. The heavily-doped portion of layer 14 may contain a concentration of a dopant, such as an impurities species from Group V of the Periodic Table (e.g., phosphorus (P), arsenic (As), or antimony (Sb)), to impart n-type conductivity. The heavy-doping level reduces the resistivity of the polysilicon and may be introduced by in situ doping that adds a dopant gas, such as phosphine or arsine, to the CVD reactant gases. A cap layer 16 of a dielectric material, such as silicon dioxide ($SiO_2$), is formed on a top surface 14a of layer 14.

Figure 2:
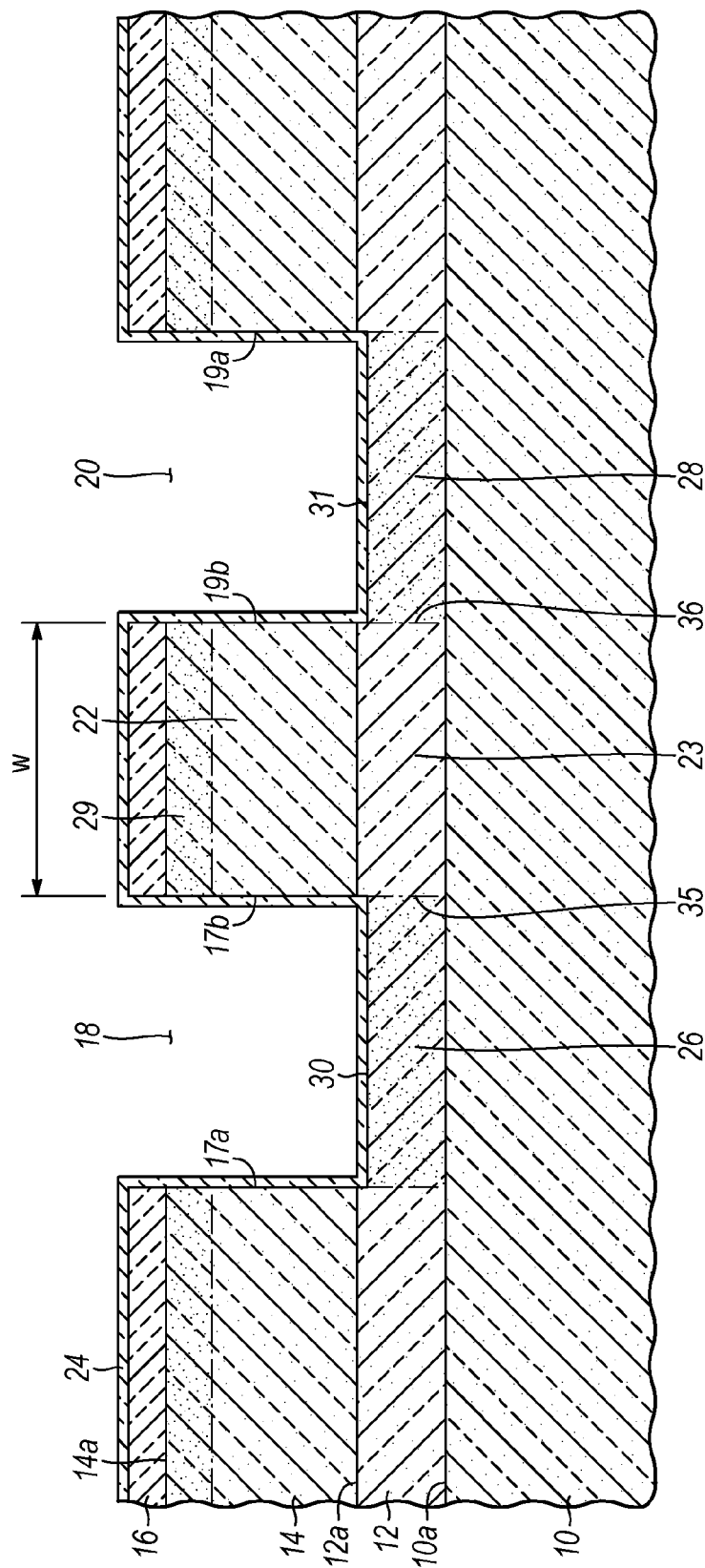

With reference to FIG. 2 in which like reference numerals refer to like features in FIG. 1 and at a subsequent fabrication stage of the processing method, trenches 18, 20 are formed with respective sidewalls 17a, 17b and sidewalls 19a, 19b that extend through the cap layer 16 and layer 14 to the top surface 12a of base layer 12. Trench 18 has a base 30 connecting the sidewalls 17a, 17b, and trench 20 has a base 31 connecting the sidewalls 19a, 19b. A pedestal in the form of a terminal 22 is defined between the trenches 18, 20, and more specifically between sidewalls 17b, 19b, from a residual section of layer 14. The terminal 22 is comprised of the semiconductor material of layer 14 and covers a section 23 of base layer 12. The terminal 22 is laterally bounded by sidewalls that are coextensive with the sidewalls 17b, 19b of trenches 18, 20.

The trenches 18, 20 may be formed using a photolithography process and an etching process. To that end, a mask layer (not shown) may be applied on the top surface of the cap layer 16. The mask layer may comprise a photoresist that is applied as a layer by a spin coating process, pre-baked, exposed to a radiation projected through a photomask, baked after exposure, and developed with a chemical developer to form an etch mask that includes a pattern of openings coinciding with the intended locations of the trenches 18, 20. The pattern of openings is transferred by the etching process from the mask layer to the layers 14, 16 and to a shallow depth into base layer 12 to define the trenches 18, 20. The etching process may comprise a wet etching process or a dry etching process, such as reactive-ion etching (RIE) that produces vertical sidewalls. The etching process, which may be conducted in a single etching step or multiple steps, relies on one or more etch chemistries and may comprise a timed etch. The mask layer is removed after forming the trenches 18, 20. If comprised of a photoresist, the mask layer may then be removed by ashing or solvent stripping, followed by a conventional cleaning process.

Before the mask layer is formed, the substrate 10 may be rotationally oriented in the lithography tool used to pattern the mask layer in the photolithography process using a feature on the substrate, such as a notch at a peripheral edge, as an angular reference. Alignment marks on the substrate 10 and photomask may also be aligned in the photolithography tool to assist in rotationally orienting the substrate 10. The openings subsequently formed in the patterned mask layer are aligned with a crystallographic plane or orientation of the crystalline semiconductor material of substrate 10. For example, the openings may be oriented parallel to the [100] directions of a single crystal silicon substrate. The preferential alignment is transferred by the etching process from the openings in the mask to the portion of the trenches 18, 20. In particular, the trenches 18, 20 are each aligned with a crystallographic plane or orientation of the crystalline semiconductor material of substrate 10.

A conformal dielectric layer 24 is formed on the top surface 12a of base layer 12 exposed at the base of the trenches 18, 20, on the sidewalls 17a, 17b of trench 18, on the sidewalls 19a, 19b of trench 20, and on the top surface of cap layer 16 in field regions. The dielectric layer 24 may be comprised of an electrical insulator with a dielectric constant (e.g., a permittivity) characteristic of a dielectric material. In one embodiment, the dielectric layer 24 may be comprised of a high temperature oxide (HTO) deposited using rapid thermal process (RTP) at temperatures of 500° C. or higher. Alternatively, the dielectric layer 24 may be comprised of oxide formed by a different deposition process, thermal oxidation of silicon (e.g., oxidation at high pressure with steam (HIPDX)), or a combination of these processes. If thermal oxidation is involved in the formation of the dielectric layer 24, then layer 12 will be slightly thinned at the bases 30, 31 of the trenches 18, 20.

Doped regions 26, 28 are formed in sections of the base layer 12 at the respective bases 30, 31 of the trenches 18, 20. The doped regions 26, 28 may be formed by introducing an impurity species to supply an electrically-active dopant. In one embodiment, the doped regions 26, 28 may be formed by implanting ions of an n-type impurity species selected from Group III of the Periodic Table (e.g., boron) effective to impart p-type conductivity. An anneal may be used to activate the impurity species and alleviate implantation damage. The ion implantation forms additional doped regions at shallow depths in field regions near the top surface of layer 14 and, specifically, a doped region 29 in an upper section of terminal 22.

Terminal 22 operates as an implantation mask for section 23 of base layer 12. Section 23 is coextensive with the doped regions 26, 28 along interfaces 35, 36, which are aligned vertically with the sidewalls of terminal 22 (i.e., sidewalls 17b, 19b of trenches 18, 20). The interfaces 35, 36 may lack the abruptness as shown in the representative embodiment because of, for example, lateral straggle during implantation. Section 23 of the base layer 12 subsequently forms an intrinsic base of the bipolar junction transistor and portions of the doped regions 26, 28 form an extrinsic base of the bipolar junction transistor. Although the relative thicknesses may differ, the intrinsic base defined by section 23 of base layer 12 has nominally the same lateral dimensions (i.e., width and length) as the terminal 22. For example, section 23 (which defines the intrinsic base in the device structure) and the terminal 22 may have nominally equal widths, $w_3$.

Figure 3:
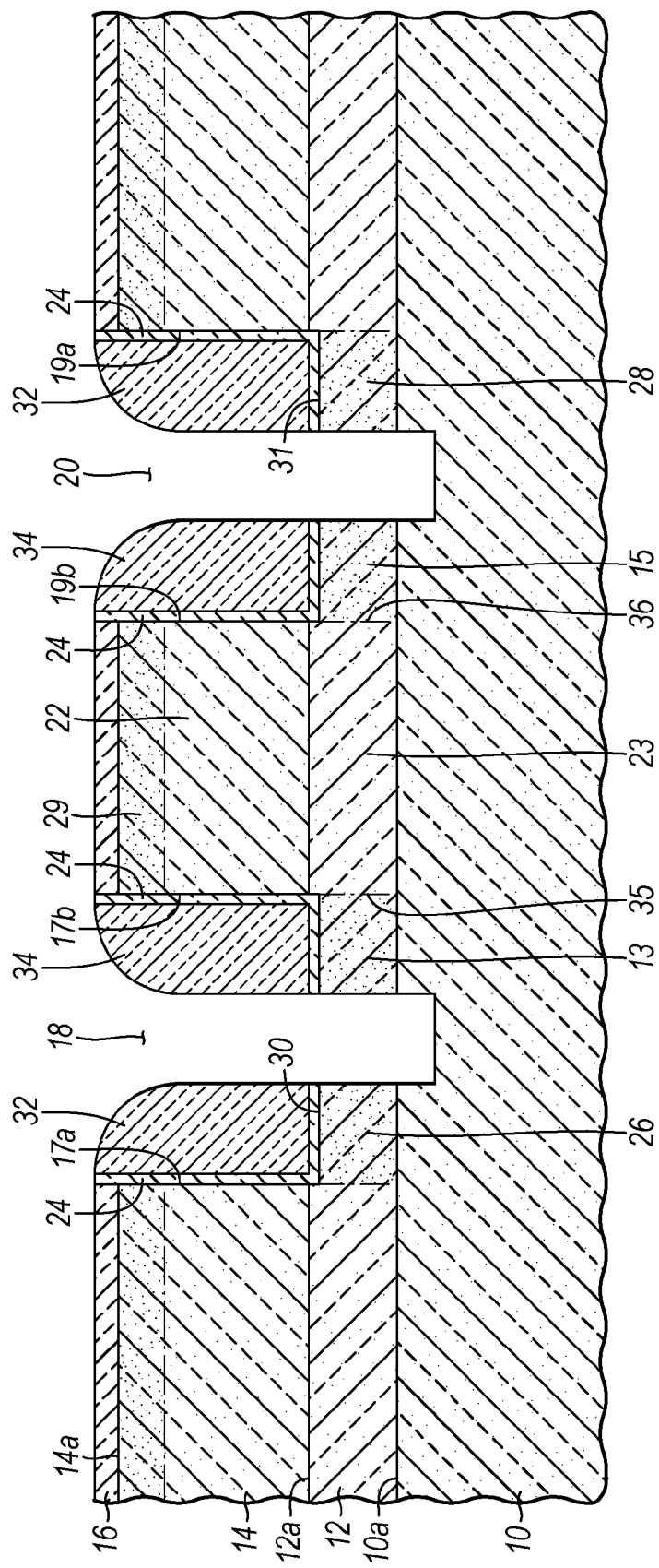

With reference to FIG. 3 in which like reference numerals refer to like features in FIG. 2 and at a subsequent fabrication stage of the processing method, dielectric spacers 32 are formed on sidewall 17a of trench 18 and sidewall 19a of trench 20, and dielectric spacers 34 are formed on sidewall 17b of trench 18 and sidewall 19b of trench 20. The dielectric spacers 32, 34 may directly contact the top surface of dielectric layer 24 at the respective bases 30, 31 of trenches 18, 20. The dielectric spacers 32, 34 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces. The dielectric spacers 32, 34 respectively function to narrow the width of the trenches 18, 20.

After the dielectric spacers 32, 34 are formed, sections of dielectric layer 24 are removed at the bases 30, 31 of the narrowed trenches 18, 20. If the dielectric layer 24 is comprised of an oxide of silicon, then a light oxide etch using buffered hydrofluoric acid or diluted hydrofluoric acid may be applied to remove the dielectric layer 24 from the top surface 12a of base layer 12. The field regions of dielectric layer 24 may be thinned by the light oxide etch.

The narrowed trenches 18, 20 are then extended through the base layer 12 and, in particular, the doped regions 26, 28 in the base layer 12 so that the bases 30, 31 are located in the underlying substrate 10. The extension of the trenches 18, 20 may be provided by an etch process with an etch chemistry that removes the semiconductor material of base layer 12 selective to the material of dielectric layer 24. Because of the addition of the spacers 34 on the sidewalls 17b, 19b (which are coextensive with the sidewalls of the terminal 22), the residual section of base layer 12 remaining after the trench extension is larger (i.e., wider and/or longer) than the terminal 22. The relatively larger size of the base layer 12 between the terminal 22 and the substrate 10 promotes the formation of intrinsic and extrinsic bases, as discussed below, for the bipolar junction transistor. Portions 13, 15 of the doped regions 26, 28 are preserved in the base layer 12 beneath the spacers 32, 34 and function as the extrinsic base of the bipolar junction transistor in the device structure.

Figure 4:
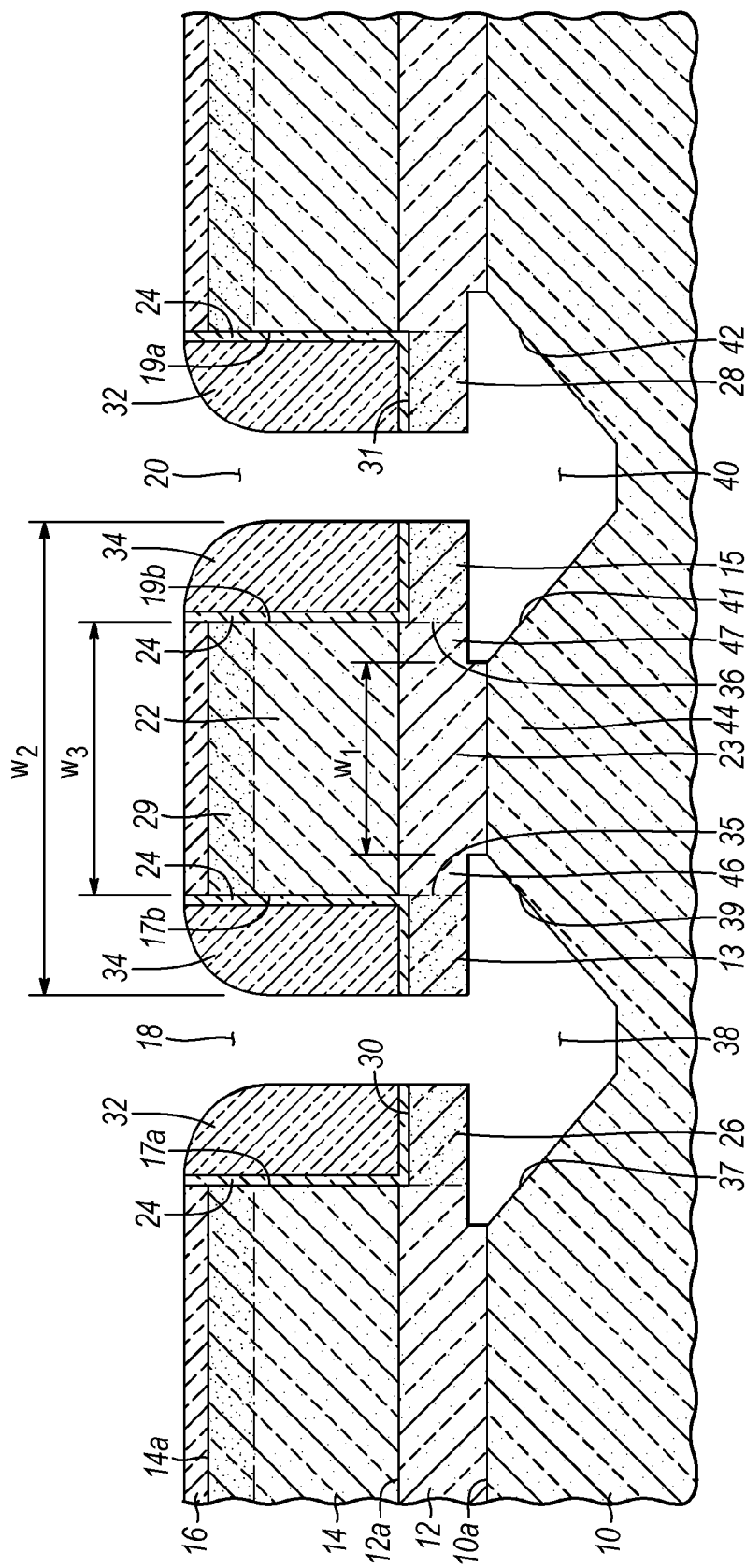

With reference to FIG. 4 in which like reference numerals refer to like features in FIG. 3 and at a subsequent fabrication stage of the processing method, trenches 38, 40 are formed in the substrate 10 by modifying the sections of the narrowed trenches 18, 20 within the substrate 10. Specifically, trenches 38, 40 are enlarged by etching the semiconductor material of substrate 10 bordering trenches 18, 20. Trenches 38, 40 are wider than the overlying residual sections of the narrowed trenches 18, 20, which have respective widths governed by the spacing between adjacent surfaces of adjacent pairs of spacers 32, 34. Trench 38 is vertically registered or aligned along a centerline with the trench 18 in base layer 12 and trench 40 is vertically registered or aligned along a centerline with the trench 20 in base layer 12.

Trench 38 includes an exterior sidewall 37 and an interior sidewall 39 that are continuous with the overlying residual section of trench 18. Trench 40 includes an interior sidewall 41 and an exterior sidewall 42 that are continuous with the overlying residual section of trench 20. Trenches 38, 40 surround a portion of the substrate 10 to define a terminal 44 and, more specifically, sidewalls 39, 41 are coextensive with (i.e., define a lateral boundary of) the terminal 44. Sidewalls 37, 39, 41, 42 have a non-perpendicular (i.e., inclined) orientation relative to the top surface 10a of substrate 10, and locations determined by the spacers 32, 34. In particular, each of the sidewalls 37, 39, 41, 42 is inclined at an angle, α, relative to the top surface 10a of substrate 10 and relative to the sidewalls of terminal 22.

The trenches 38, 40 may be created with an orientation-dependent etching process, called an anisotropic etching process herein, that may have different etch rates for different crystallographic directions in a semiconductor and/or that may have different etch rates for semiconductors of different doping or different compositions. The anisotropic etching process etches the semiconductor material of the substrate 10 bordering the sidewalls 17a, 17b of trench 18 and the sidewalls 19a, 19b of trench 20 (FIG. 3) in all crystallographic directions, but at significantly different etching rates for different crystal directions or planes. For example, silicon etching in tetramethylammonium hydroxide (TMAH) is relatively slow for (111) crystal planes compared to other directions, such as (100) planes or (110) planes. Therefore, the etch pattern formed by the anisotropic etching process proceeds along the crystal planes of higher etching rate and is eventually terminated by the crystal planes of lower etching rate. The absolute etch rates in each crystallographic direction and the relative etch rate in different crystallographic directions may be dependent upon factors such as solution strength (i.e., concentration) and solution temperature of the etchant. The etch time for exposure to the etchant may be selected to be adequate to produce a targeted change in sidewall geometrical shape. In one embodiment, the anisotropic etching process may be a wet chemical etching process that uses an etchant comprising TMAH, ammonium hydroxide ($NH_4OH$), ethylenediamine pyrocatechol (EDP), or potassium hydroxide (KOH).

In a representative embodiment in which the substrate 10 is single crystal silicon having a [100] surface normal and the trenches 18, 20 in the substrate 10 are initially aligned with a [100] direction, the sidewalls 17a, 17b, 19a, 19b are aligned with crystallographically equivalent (110) planes before the anisotropic etching process is performed. After a given timed etch, the sidewalls 37, 39, 41, 42 of the trenches 38, 40 may be inclined at a nominal angle, α, of 45° relative to the top surface 10a. An impurity species, such as boron, may be optionally implanted into the substrate 10 at the bases 30, 31 of trenches 18, 20 prior to the anisotropic etching process in order to decrease the etch rate of the substrate 10 in a vertical direction when the trenches 38, 40 are formed. The retardation of the etch rate can be used to control the depth of the trenches 38, 40.

In the representative embodiment, the base layer 12 includes strata of different compositions, and the material of stratum in proximity to substrate 10 has a higher etch rate than an overlying stratum that is not etched or is only minimally etched. As a result, the trenches 38, 40 extend vertically for a short distance into the base layer reflecting the removal of the stratum proximate to the top surface 10a and the non-removal or minimal removal of the stratum remote from the top surface 10a. Because of etch selectivity, the sidewalls 17a, 17b, 19a, 19b of trenches 18, 20 may nominally retain their original separation in base layer 12, and thereby remain nominally vertical and perpendicular to the top surface 10a.

Sections 46, 47 of the base layer 12 are undercut by the trenches 38, 40 and, depending on the composition (e.g., silicon without added germanium over a thickness adjacent to the substrate 10 and terminal 44 in substrate 10), by the removal of the lower stratum of base layer 12. In the representative embodiment, the sections 46, 47 of the base layer 12 include portions 13, 15 of doped regions 26, 28 and extend inwardly past the interfaces 35, 36 beneath section 23 of the base layer 12. However, the undercutting may end at or before the interfaces 35, 36 so that sections 46, 47 of the base layer 12 only include all or a portion of the portions 13, 15 of doped regions 26, 28. The undercutting reduces the width, $w_1$, of the terminal 44 proximate to the base layer 12 in comparison with the width, $w_2$, of the base layer 12, which reduces the surface area of the interface between the base layer 12 and terminal 44.

Figure 5:
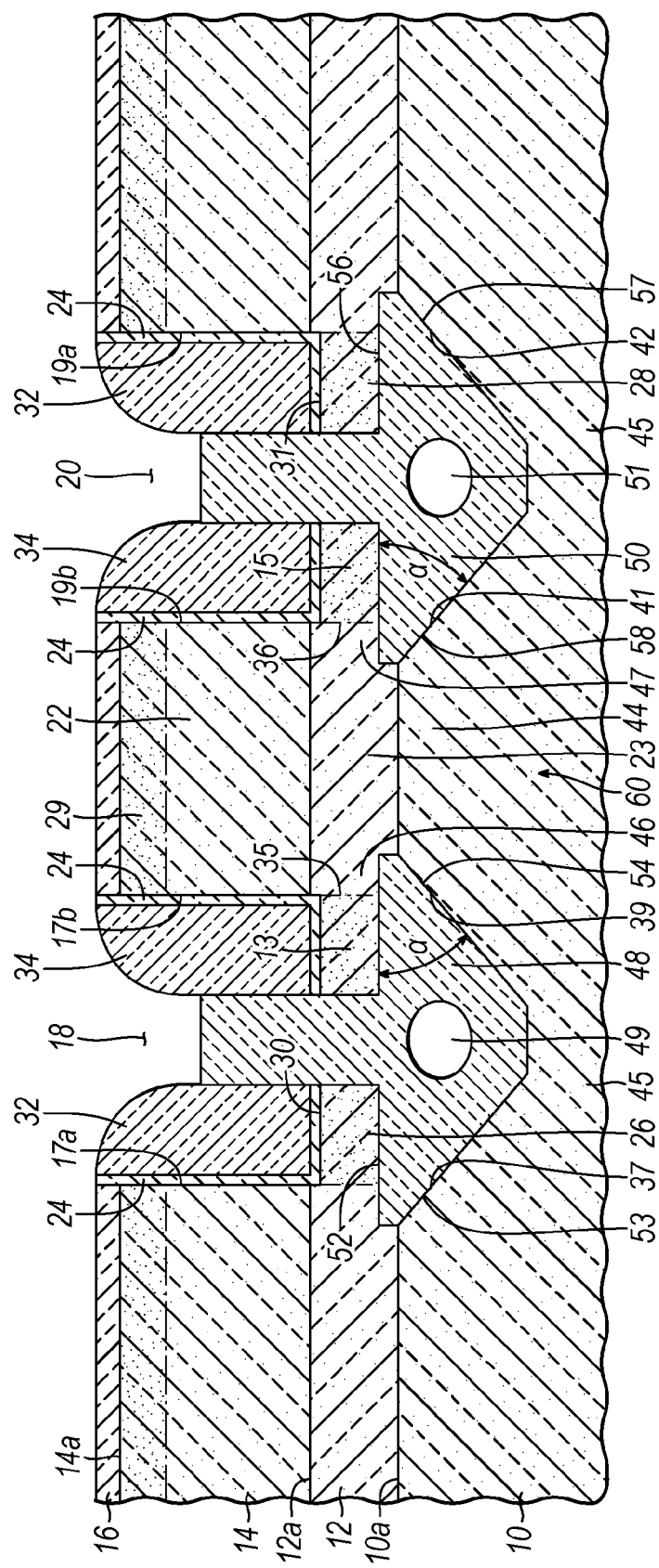

With reference to FIG. 5 in which like reference numerals refer to like features in FIG. 4 and at a subsequent fabrication stage of the processing method, isolation structures 48, 50 comprised of an electrical insulator are formed in the trenches 38, 40. The respective sections of the isolation structures 48, 50 in the substrate 10 and beneath the sections 46, 47 of the base layer 12 reproduce the geometrical shape of the trenches 38, 40 and are nominally identical to each other. The isolation structures 48, 50 have extensions that project upwardly within the spatial limit of the trenches 18, 20 that respectively overlie trenches 38, 40.

Isolation structure 48 is characterized by a top surface 52 and sidewalls 53, 54 that are inclined at angle, $\alpha$, relative to the top surface 52 as constrained by the geometrical shape of trench 38. Sidewalls 53, 54 are coextensive with the sidewalls 37, 39 of trench 38. Isolation structure 50 is characterized by a top surface 56 and sidewalls 57, 58 that are inclined at angle, $\alpha$, as constrained by the geometrical shape of trench 40. Sidewalls 53, 54 are coextensive with the sidewalls 41, 42 of trench 40.

Isolation structures 48, 50 surround the terminal 44 and, more specifically, sidewall 54 of isolation structure 48 and sidewall 58 of isolation structure 50 are coextensive with (i.e., define a boundary of) the terminal 44. Shallow trench isolation structures may be omitted from the device construction because of the electrical isolation provided by the isolation structures 48, 50. The isolation structures 48, 50 also at least partially delimit the lateral extent of a device region, which is generally indicated by reference numeral 60, in the substrate 10. Portions of the isolation structures 48, 50 occupy the undercut spaces in the substrate 10 beneath sections 46, 47 of the base layer 12, and that eventually underlie the extrinsic base. A sub-terminal 45, which is represented by a doped region of the substrate 10, extends laterally beneath the isolation structures 48, 50 for coupling the terminal 44 with an external contact in the MEOL wiring.

To form the isolation structures, a dielectric layer is deposited that fills the trenches 38, 40 with respective portions of the electrical insulator comprising the isolation structures 48, 50. The dielectric layer also deposits on the dielectric layer 24 and spacers 32, 34. The dielectric layer may comprise any suitable organic or inorganic dielectric material, which may be an electrical insulator characterized by an electrical resistivity at room temperature of greater than $10^{10}(\Omega\text{-m})$. Candidate inorganic dielectric materials for dielectric layer may include, but are not limited to, silicon dioxide ($SiO_2$), fluorine-doped silicon glass (FSG), and combinations of these dielectric materials. Alternatively, the dielectric layer may comprise a low-k dielectric material characterized by a relative permittivity or dielectric constant smaller than the $SiO_2$ dielectric constant of approximately 3.9. Candidate low-k dielectric materials for dielectric layer include, but are not limited to, porous and nonporous spun-on organic low-k dielectrics, such as spin-on spun-on aromatic thermoset polymer resins like polyarylenes, porous and nonporous inorganic low-k dielectrics, such as organosilicate glasses, hydrogen-enriched silicon oxycarbide (SiCOH), and carbon-doped oxides, and combinations of these and other organic and inorganic dielectrics. Dielectric layer may be deposited by any number of techniques including, but not limited to, sputtering, spin-on application, or CVD.

The dielectric layer is removed from field regions, but not from within the trenches 38, 40, by a wet etching process or a dry etching process. If the dielectric layer is comprised of an oxide of silicon, then an end-pointed RIE or an end-pointed oxide etch, such as buffered hydrofluoric acid or diluted hydrofluoric acid, may be employed to remove the dielectric layer from the field regions. The isolation structures 48, 50 of the dielectric layer are recessed such that, for example, the respective extensions remain in the trenches 18, 20. Cap layer 16 may be removed by this etching process.

In one specific embodiment, the dielectric layer used to form the isolation structures 48, 50 may be comprised of an oxide of silicon (e.g., $SiO_2$) deposited by low pressure chemical vapor phase deposition (LPCVD) using a silicon source of either silane or a mixture of silane with nitrogen. For example, the substrate temperature during LPCVD may range from 600° C. to 650° C. and the process chamber pressure during LPCVD may be range from 25 Pa to 150 Pa.

In the representative embodiment, isolation structures 48, 50 may include subsurface voids 49, 51 that are introduced into the constituent dielectric material during deposition. The subsurface voids 49, 51 operate to lower the composite dielectric constant of the dielectric material comprising isolation structures 48, 50. The subsurface voids 49, 51 each represent one or more empty spaces devoid of solid matter. The subsurface voids 49, 51 may have an effective dielectric constant of approximately unity (about 1.0) and may be filled by air at or near atmospheric pressure, filled by another gas at or near atmospheric pressure, or contain air or gas below atmospheric pressure (e.g., a partial vacuum) in the completed microelectronic structure. The subsurface voids 49, 51 are preferably buried at a depth within the isolation structures 48, 50 such that the subsurface voids 49, 51 remain sealed during post-deposition processing.

Figure 6:
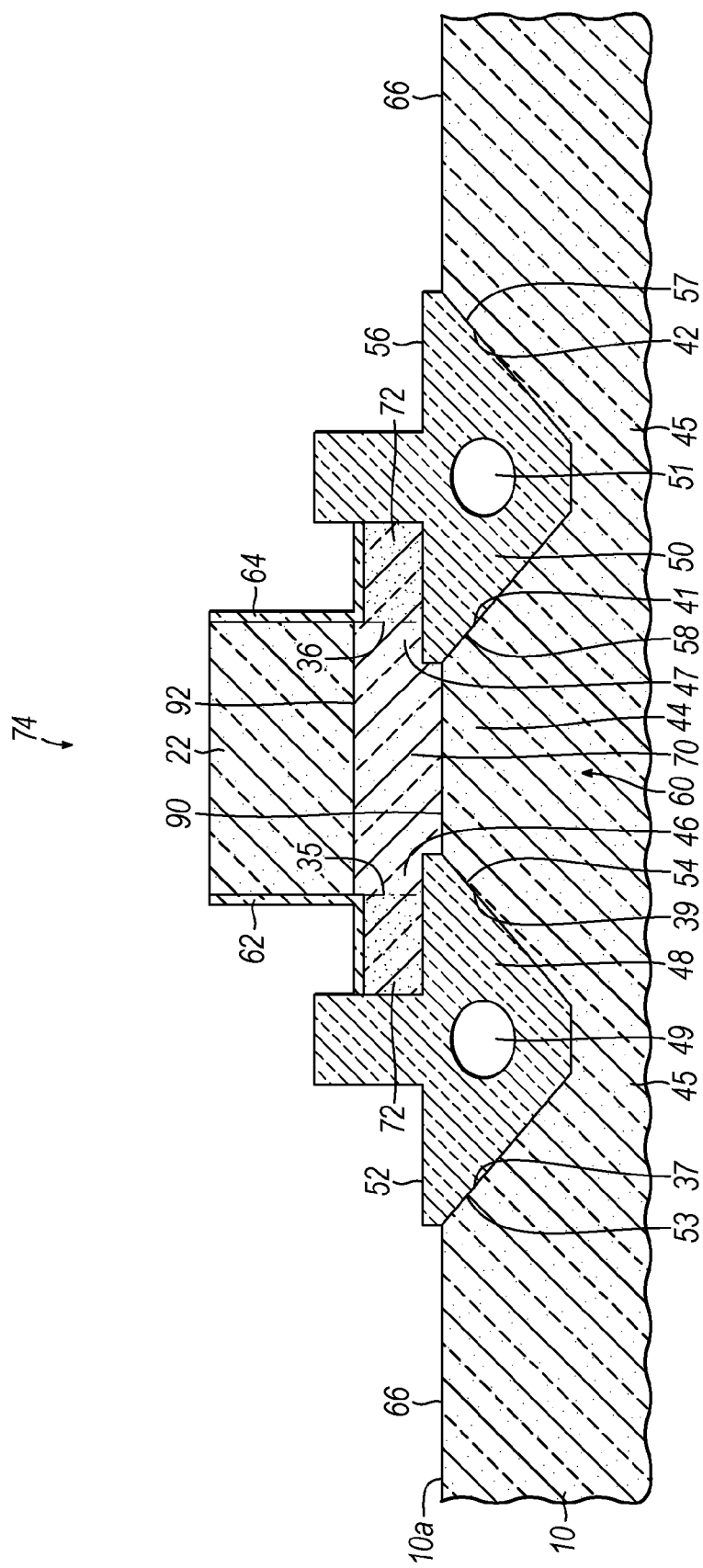

With reference to FIG. 6 in which like reference numerals refer to like features in FIG. 5 and at a subsequent fabrication stage of the processing method, cap layer 16 is removed, layer 14 is thinned, and the spacers 32, 34 are removed. To that end, layer 14 and thicknesses of layer 14 doped by the implantation forming doped regions 26, 28 are removed using one or more etching processes. In particular, an etchant may be selected that preferentially removes the doped semiconductor of layer 14 at a higher rate than the undoped semiconductor material of layer 14 so that the etch process is controlled. In particular, the etching process may shorten the height of terminal 22 by preferentially removing the doped semiconductor material of layer 14. In one embodiment, a wet chemical etchant comprised of a solution of hydrofluoric acid (HF) and nitric acid ($HNO_3$) may be used. The spacers 32, 34 may be removed using another etching process, such as a hot phosphoric acid etch or RIE with a suitable etch chemistry. Sections of dielectric layer 24, which may be shortened by the etching process and truncated vertically by the etching process used in the formation of the isolation structures 48, 50, remain as spacers 62, 64.

Sections of layers 12, 14 are removed using a photolithography process and an etching process to define a contact region 66 to the sub-terminal 45. The photolithography process is adapted to protect the terminal 22 from the etching process. To that end, a mask layer (not shown) may be applied on the top surface of the layer 14. The mask layer may comprise a photoresist that is applied as a layer by a spin coating process, pre-baked, exposed to a radiation projected through a photomask, baked after exposure, and developed with a chemical developer to form an etch mask that includes an island coinciding with the location of terminal 22. The etching process may comprise a wet etching process or a dry etching process, such as reactive-ion etching (RIE) that produces vertical sidewalls. The etching process, which may be conducted in a single etching step or multiple steps, relies on one or more etch chemistries and may comprise a timed etch. The mask layer is removed after the conclusion of the etching process. If comprised of a photoresist, the mask layer may then be removed by ashing or solvent stripping, followed by a conventional cleaning process.

Section 23 of base layer 12 defines an intrinsic base 70 in the device structure for the bipolar junction transistor 74 that adjoins the terminal 22. The residual portions 13, 15 of doped regions 26, 28, which surround the intrinsic base 70, define an extrinsic base 72 in the device structure for the bipolar junction transistor 74. The extrinsic base 72 is directly coupled with the intrinsic base 70 along a boundary established by interfaces 35, 36, which boundary defines an outer or peripheral edge of the intrinsic base 70 and an inner edge of the extrinsic base 72. The intrinsic base 70 and extrinsic base 72 have a juxtaposed and continuous arrangement (i.e., a side-by-side arrangement that lacks overlap and is seamless at the interfaces 35, 36 between the section 23 and doped regions 26, 28) and have top and bottom surfaces that are coplanar (i.e., the intrinsic base 70 and extrinsic base 72 have the same layer thickness or the intrinsic base 70 may be slightly thicker if thermal oxidation is involved in the formation of the dielectric layer 24 and consumes a thin surface layer of doped regions 26, 28).

The bipolar junction transistor 74 has a vertical architecture in which the intrinsic base 70 is located vertically between the terminals 22, 44. Terminal 44 of the bipolar junction transistor 74 is defined beneath the top surface 10a of the substrate 10. One junction 90 is defined at the interface over which the terminal 44 and intrinsic base 70 are coextensive. Another junction 92 is defined at the interface over which the terminal 22 and intrinsic base 70 are coextensive. The bipolar junction transistor 74 may be characterized as a heterojunction bipolar transistor (HBT) if two or all three of the terminals 22, 44 and intrinsic base 70 are comprised of different semiconductor materials.

In one embodiment, terminal 44 operates as a collector of the bipolar junction transistor 74 and terminal 22 operates as an emitter of the bipolar junction transistor 74 with the intrinsic base 70 therebetween. In an alternative embodiment, terminal 44 operates as an emitter of the bipolar junction transistor 74 and terminal 22 operates as a collector of the bipolar junction transistor 74 with the intrinsic base 70 therebetween. In this alternative configuration, any need to contact the collector with a through-silicon via (TSV) may be avoided.

The bipolar junction transistor 74 is formed by a self-aligned process that leverages the trenches 18, 20 extending through layers 12, 14, trenches 38, 40, and isolation structures 48, 50 formed in trenches 38, 40. The self-aligned process eliminates one or more masks needed to pattern device layers in other fabrication processes. For example, the self-alignment supplied by use of the terminal 22 as an etch mask and implantation mask permits comparatively large widths for the terminal 22, which may be beneficial in high power applications (e.g., power amplifiers) for bipolar junction transistor 74. In addition, the extrinsic base 72 of the bipolar junction transistor 74 is not positioned on the top surface of the intrinsic base 70 and, hence, is not raised. The extrinsic base 72 and terminal 22 are not laterally separated by dielectric (i.e., non-conductive) spacers for electrical isolation. Instead, terminal 22 is elevated above the extrinsic base 72 in the device construction, and has a lower surface at the junction 92 that is above the upper surface of the extrinsic base 72 (i.e., the upper surface of the extrinsic base 72 is below the lower surface of terminal 22.

With reference to FIG. 7 in which like reference numerals refer to like features in FIG. 6 and at a subsequent fabrication stage of the processing method, the bipolar junction transistor 74 is completed by forming dielectric spacers 76, 78 on the sidewalls of the terminal 22. The dielectric spacers 76, 78 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces.

During the front-end-of-line (FEOL) portion of the fabrication process, the device structure of the bipolar junction transistor 74 is replicated across at least a portion of the surface area of the substrate 10. In BiCMOS integrated circuits, complementary metal-oxide-semiconductor (CMOS) transistors (not shown) may be formed using other regions of the substrate 10. As a result, both bipolar and CMOS transistors may be available on the same substrate 10.

Standard silicidation, middle-end-of-line (MEOL), and back-end-of-line (BEOL) processing follows, which includes formation of contacts and wiring for the local interconnect structure, and formation of dielectric layers, via plugs, and wiring for an interconnect structure coupled by the interconnect wiring with the bipolar junction transistor 74, as well as other similar contacts for additional device structures like bipolar junction transistor 74 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

In particular, a silicide layer 81 is formed on the sub-terminal 45, the extrinsic base 72 and the terminal 22. The silicide layer 81 on the sub-terminal 45 may be contacted by contacts 80, 82. Contact 80, 82 are coupled by the sub-terminal 45 with the terminal 44. The isolation structures 48, 50 define the boundary of the terminal 44 and permit the terminal 44 to be contacted using the sub-terminal 45. The silicide layer 81 on the extrinsic base 72 may be contacted by contacts 84, 86. Contact 84, 86 are coupled by the extrinsic base 72 with the intrinsic base 70. The silicide layer 81 on the terminal 22 may be contacted by contact 88. The contacts 80, 82, 84, 86, 88 are disposed in a dielectric layer (not shown) of the BEOL interconnect structure.

Figure 8:
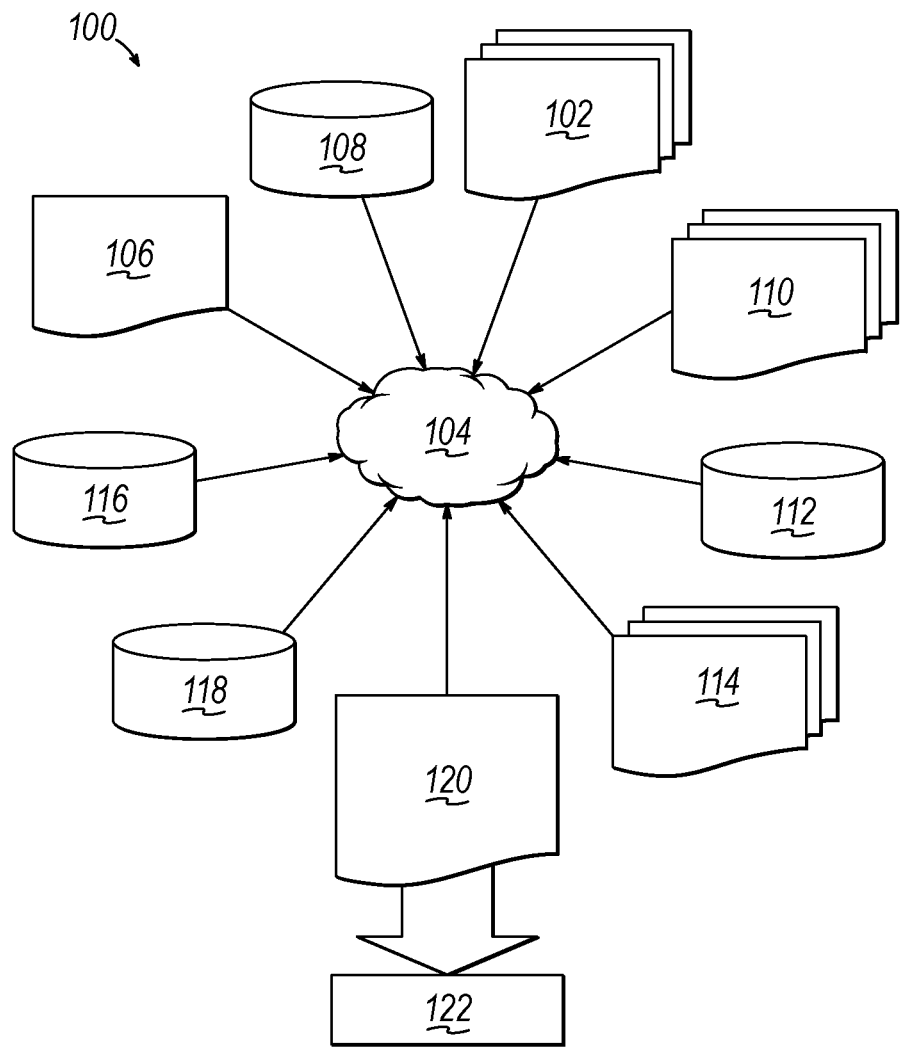
FIG. 8 is a flow diagram of a design process used in semiconductor design, manufacture, and/or test.

FIG. 8 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 7. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 7 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 7. In one embodiment, design structure 120 may comprise a compiled, executable HDL simulation model that functionally simulates the devices shown in FIG. 7.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 7. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor formed using a substrate, the device structure comprising:
    an intrinsic base on the substrate, the intrinsic base comprised of a first semiconductor material from a first section of a single-crystal layer;
    a first terminal on the intrinsic base, the first terminal separated from the substrate by the intrinsic base, the first terminal having a sidewall, and the first terminal comprised of a second semiconductor material different from the first semiconductor material;
    an extrinsic base arranged in juxtaposition with the intrinsic base on the substrate, the extrinsic base comprised of the first semiconductor material from a second section of the single-crystal layer, and the extrinsic base coextensive with the intrinsic base along a vertical interface that is aligned with the sidewall of the first terminal; and
    an isolation structure in the substrate, the isolation structure including a portion that underlies the extrinsic base, and the portion of the isolation structure extending laterally past the vertical interface to underlie the intrinsic base.

2. The device structure of claim 1 wherein the first terminal is an emitter of the bipolar junction transistor.

3. The device structure of claim 1 wherein the first terminal is a collector of the bipolar junction transistor.

4. The device structure of claim 1 wherein the intrinsic base has a first electrical conductivity, and the extrinsic base has a second electrical conductivity greater than the first electrical conductivity of the intrinsic base.

5. The device structure of claim 1 wherein the first terminal and the intrinsic base have equal widths in a plane parallel to a top surface of the substrate.

6. The device structure of claim 1 wherein the portion of the isolation structure extends directly beneath the intrinsic base.

7. The device structure of claim 1 wherein the intrinsic base and the extrinsic base have respective top and bottom surfaces that are coplanar.

8. The device structure of claim 1 wherein the intrinsic base and the extrinsic base have the same layer thickness.

9. The device structure of claim 1 wherein the portion of the isolation structure includes an inclined sidewall that extends laterally past the vertical interface to underlie the intrinsic base.

* * * * *